(12) United States Patent
Zanchi et al.

(10) Patent No.: US 9,281,784 B2
(45) Date of Patent: Mar. 8, 2016

(54) HIGH-GAIN LOW-NOISE PREAMPLIFIER AND ASSOCIATED AMPLIFICATION AND COMMON-MODE CONTROL METHOD

(71) Applicant: Aeroflex Colorado Springs Inc., Colorado Springs, CO (US)

(72) Inventors: Alfio Zanchi, Huntington Beach, CA (US); Shinichi Hisano, Colorado Springs, CO (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 0 days.

(21) Appl. No.: 14/558,525

(22) Filed: Dec. 2, 2014

(65) Prior Publication Data

US 2015/0180424 A1 Jun. 25, 2015

Related U.S. Application Data

(63) Continuation of application No. 13/749,488, filed on Jan. 24, 2013, now Pat. No. 8,928,408.

(51) Int. Cl.
*H03F 3/45* (2006.01)
*H03F 1/26* (2006.01)
(Continued)

(52) U.S. Cl.
CPC .................. *H03F 1/26* (2013.01); *H03F 3/005* (2013.01); *H03F 3/195* (2013.01); *H03F 3/45076* (2013.01); *H03F 3/45183* (2013.01); *H03F 3/45659* (2013.01); *H03F 2200/294* (2013.01); *H03F 2200/372* (2013.01); *H03F 2203/45112* (2013.01); *H03F 2203/45116* (2013.01); *H03F 2203/45402* (2013.01);
(Continued)

(58) Field of Classification Search
CPC ........................................................ H03F 3/45
USPC .......................... 330/258, 253, 257, 69, 261
See application file for complete search history.

(56) References Cited

U.S. PATENT DOCUMENTS

| | | | |
|---|---|---|---|
| 4,105,942 A | 8/1978 | Henry | |
| 4,605,906 A * | 8/1986 | Miller | H03F 1/3211 330/149 |

(Continued)

OTHER PUBLICATIONS

Kelly, D. et al., A 3V 340mW 14b 75MSPS CMOS ADC with 85dB SFDR at Nyquist, Analog Devices Inc., Wilmington, MA, 2001 IEEE International Solid-State Circuits Conference, 0-7803-6608-5, 3 pgs.

(Continued)

*Primary Examiner* — Henry Choe
(74) *Attorney, Agent, or Firm* — Peter J. Meza; Hogan Lovells US LLP

(57) ABSTRACT

A preamplifier includes a differential pair of transistors receiving a bias current having a differential input and a differential output, a first resistor coupled to a first differential output node, a first transistor having a current path coupled between the first resistor and a power supply, a second resistor coupled to the first differential output node, a second transistor having a current path coupled between the second resistor and the power supply, a third resistor coupled to a second differential output node, a third transistor having a current path coupled between the third resistor and the power supply, a fourth resistor coupled to the second differential output node, and a fourth transistor having a current path coupled between the fourth resistor and the power supply, wherein a source of the second and third transistors are coupled together.

14 Claims, 4 Drawing Sheets

(51) Int. Cl.
*H03F 3/00* (2006.01)
*H03F 3/195* (2006.01)

(52) U.S. Cl.
CPC ............... *H03F 2203/45408* (2013.01); *H03F 2203/45631* (2013.01); *H03F 2203/45702* (2013.01)

(56) References Cited

U.S. PATENT DOCUMENTS

| | | | |
|---|---|---|---|
| 5,389,891 A * | 2/1995 | Philippe | H03F 1/0283 330/253 |
| 6,087,899 A * | 7/2000 | Kubota | H03F 1/48 330/253 |
| 6,664,820 B1 | 12/2003 | Estrada | |
| 6,664,912 B1 | 12/2003 | Zanchi | |
| 6,703,898 B2 * | 3/2004 | Renous | 330/253 |
| 6,750,715 B2 | 6/2004 | Allott et al. | |
| 7,026,865 B2 | 4/2006 | Arguelles | |
| 7,474,151 B2 | 1/2009 | Gopinathan et al. | |
| 7,859,339 B2 * | 12/2010 | Ide | 330/257 |
| 8,090,334 B1 * | 1/2012 | Yahav | H03F 3/245 330/254 |
| 8,289,077 B2 | 10/2012 | Bruin | |
| 8,471,634 B2 * | 6/2013 | Lin | 330/258 |

OTHER PUBLICATIONS

Singer, L. et al., MP 2.3 A 12b 65MSample/s CMOS ADC with 82dB SFDR at 120MHz, Analog Devices Inc., Wilmington, MA, 2000 IEEE International Solid-State Circuits Conference, 07803-5853-8/00, 2 pgs.

Michalski, C., A 12b 105Msample/S, 850mW Analog to Digital Converter, Analog Devices Inc., Greensboro, NC, 2000 Symposium on VLSI Circuits Digest of Technical Papers, 0-7803-6309-4/00, pp. 208-211.

Zanchi, A., A 16-bit 65-MS/s 3.3-V Pipeline ADC Core in SiGe BiCMOS With 78-dB SNR and 180-fs Jitter, IEEE Journal of Solid-State Circuits, vol. 40, No. 6, Jun. 2005, pp. 1225-1237.

* cited by examiner

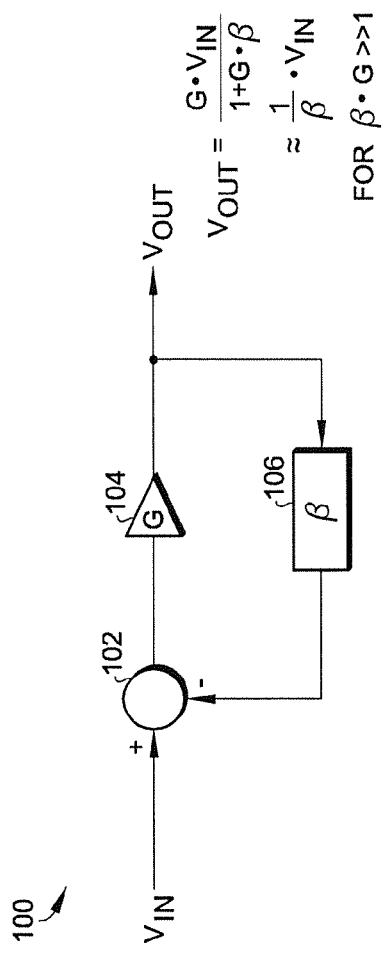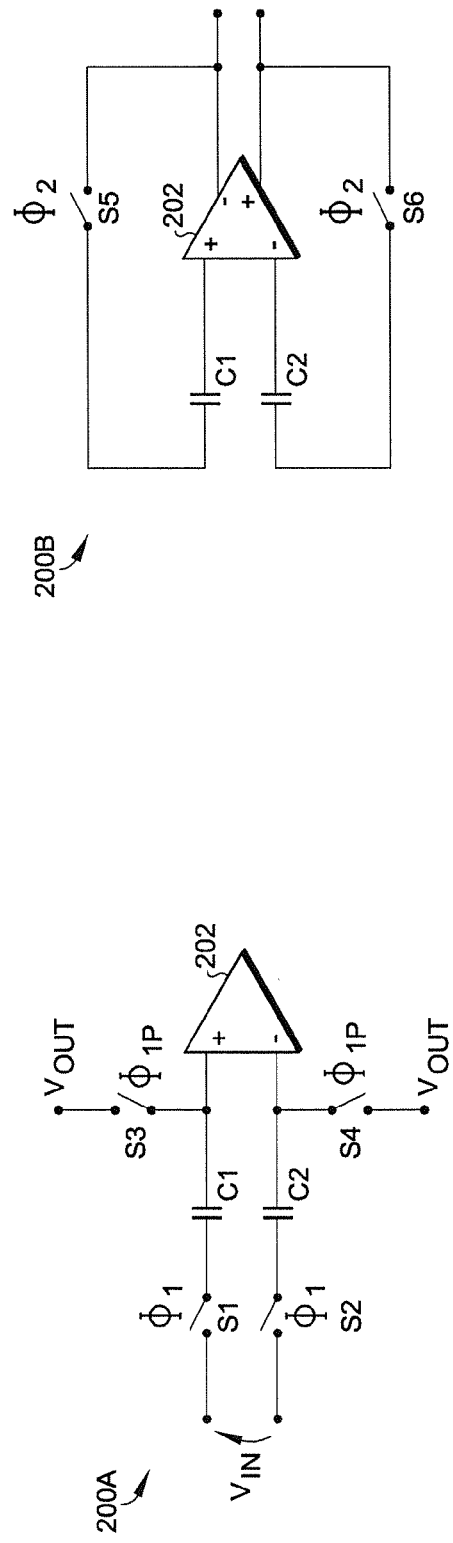

HIGH-GAIN LOW-NOISE PREAMPLIFIER AND ASSOCIATED AMPLIFICATION AND COMMON-MODE CONTROL METHOD

RELATED APPLICATION

The present application is a continuation to and claims the benefit of priority to U.S. patent application Ser. No. 13/749,488, filed Jan. 24, 2013 which is hereby incorporated by reference in its entirety for all purposes as if fully set forth herein.

BACKGROUND OF THE INVENTION

The present invention relates to a preamplifier used as the input stage of an operational amplifier commonly resident in the front-end of a Sample-and-Hold circuit, and more particularly to a load circuit for the preamplifier.

Operational amplifiers (OP-AMPs) are among the most basic and ubiquitous building blocks used in hybrid and integrated semiconductor circuits. The OPAMP is fed an input signal in the form of a differential or single-ended voltage waveform, and ideally amplifies it at its output in linear fashion, according to the gain law:

$$V_{out}(t) = G \cdot V_{in}(t)$$

where the gain G is independent of the input signal. The gain G is usually maximized in view of the use of the OPAMP in feedback configurations, where negative feedback loop topologies allow for synthesizing a precise amount of forward gain when the loop gain is maximized. Defined as G the combined gain of one or a cascade of amplifying stages (usually comprising OPAMPs) and as β the feedback factor of a precision network connecting the systems' output back to the input, for values of the loop gain $G \cdot \beta \gg 1$ the output is approximately equal to the input amplified by $1/\beta$, as is shown in FIG. 1. FIG. 1 is a simplified schematic of a circuit 100 (feedback loop) operating on the input voltage $V_{IN}$ and generating an output voltage $V_{out}$ that includes summer 102, a forward gain block 104 usually including an operational amplifier, and a feedback block 106.

It is therefore desirable to augment the value of the combined gain G in the forward path, i.e., to build OPAMPs with high gain for inclusion into feedback loops. On the other hand, the transfer function of OPAMPs is always characterized by a non-ideal frequency response: i.e., a pole/zero constellation in the s-domain of the Laplace transform that determines a $V_{out}(t)$ response $\neq G \cdot V_{in}(t)$, with multi-pole low-pass filtering effects in general taking place. Other non-idealities such as offset (e.g., dictated by imbalances in the OPAMP's symmetry in differential implementations) and noise (which can descend from basic thermal contributions; barrier effects in the case of shot noise; and low-pass shaped terms such as popcorn noise and 1/f, or flicker, noise) also impact the practical implementation of OPAMPs. The characteristics of the OPAMP generally are governed by trade-offs, whereby an OPAMP structure can be optimized for speed at the expense of higher noise, due to the wide bandwidth; or for gain at the price of speed, when a straightforward cascade of stages is effected and the poles combine to limit the useable bandwidth.

The present invention solves the problem of optimizing a trade-off particularly critical in the front-ends of high-speed, high-resolution mixed signal circuits such as the sample/hold or the track/hold found at the inputs of data acquisition chains, such as in Analog-to-Digital Converters (ADCs). A popular scheme of Sample-and-Hold Amplifier (SHA) is the switched-capacitor "flip-around" structure. In this topology, the input signal is differentially sampled over an input capacitor pair, and then—in a non-overlapping complementary clock phase—fed on to the successive stages of conversion by using an OPAMP. The amplifier device provides the driving capability required to force the output, as governed by the voltage held on the capacitors in the pair, which are now reconfigured as feedback elements by means of a switch network.

FIG. 2(a) shows the switched-capacitor Sample-and-Hold structure 200A in the sampling phase. The basic circuit includes an operational amplifier 202, a first capacitor C1 coupled to the positive input of the amplifier, and a second capacitor C2 coupled to the negative input of the amplifier. In the sampling phase, switches S1, S2, S3 and S4 are closed. The transition to holding phase is executed by opening the switches S3, S4 first, followed by opening switches S1, S2 immediately thereafter.

FIG. 2(b) shows the same switched-capacitor structure 200B in the holding phase, wherein all the switches S1 through S4 have been opened and additional feedback switches S5 and S6 are closed in a complementary, non-overlapping clock phase.

The precision limits of the circuit topology shown in FIGS. 2(a) and 2(b) hinge upon the gain attainable inside the differential OPAMP. The operational amplifier also determines the properties of transient settling of the SHA, which ultimately dictates the sampling rate that the discrete-time system can sustain. Such settling behavior depends on the stability of the closed-loop circuit configuration, precisely determined by the phase margin $\phi_M$ of the open-loop gain, and often—in ultimate analysis—of the OPAMP itself. Then, the noise introduced by the OPAMP usually exceeds the kT/C sampling noise stored on the capacitors, and the SHA performance in terms of resolution—limited by noise and settled signal accuracy—is ultimately limited by the combined noise and speed characteristics of the OPAMP.

A popular OPAMP topology used to implement amplifiers for SHA front-ends makes use of a preamplifier in front of a telescopic gain stage, as shown, e.g., in Zanchi (U.S. Pat. No. 6,664,912). The wide-band design of the preamplifier allows in fact for the avoidance of pole-splitting dynamics such as the ones observed (and exploited) in the design of two-stage amplifiers, since the G(s) (gain profile vs. frequency, a Laplace transform) of the telescopic cascode of devices of the gain stage is gained up, and simultaneously broad-banded, by the gain of the preamplifier—whose own singularities lie at higher frequencies. However, the additional preamplifier stage injects its own noise in the loop, and only a certain threshold level of preamplifier gain allows for compensating this additional noise, since the input-referred noise contribution of the following stage is abated by a factor equal to the preamplifier gain. Moreover, being a differential circuit, the preamplifier still requires some form of common-mode level control to set the voltage level of its outputs.

Prior art solutions to the OPAMP's noise and stability problems rely on purely resistive differential loads on the preamplifier differential input pair, in order to broad-band the stage itself due to the lower impedance of the preamplifier driving the second stage, as declared by Zanchi and Tsay (IEEE JSSC, 2005) and yet previously by Michalski (IEEE VLSI Symposium, 2000). It is important to note that both solutions appear superior to Zanchi in terms of bandwidth, since no active device (such as PMOSFETs M11, M12 in FIG. 3 to Zanchi) is connected in parallel to the resistive load in these other implementations. The preamplifier of Zanchi and Tsay does not require a specific common-mode control, while Michalski introduces a common-mode feedback loop driving the PMOSFET in FIG. 3 thereof. None of these prior art solutions discuss the issue of noise in the OPAMP. However, these inventors point out that, noise-wise, Michalski and Zanchi/Tsay are also superior to Zanchi, since any noise coming from the active device connected to the center tap of the resistors is common-mode noise: therefore, it does not play a role in the differential noise referred to the input of the amplifier, given the OPAMP's differential nature. In Zanchi, much like in Singer et al. (IEEE ISSCC, 2000) and Kelly et al. (IEEE ISSCC, 2001) the noise of active devices is instead propagated to the differential output, leading to inferior Signal/Noise Ratio (SNR) performance.

From this observation stems, nevertheless, only one side of the noise-speed tradeoff: preamplifier gains of four (Zanchi/Tsay) or eight (Michalski) do not optimize the balance between noise added by the preamplifier and abatement of the noise generated from the OPAMP second stage, as will be shown by simulation. What is desired, therefore, in order to reach an optimal level of preamplifier gain vs. noise and control the common-mode bias of the circuit, is a combination of a purely resistive differential load with a common-mode feedback driving a common-mode connected active device (for lower preamplifier noise and common-mode control); and of a mixed active/passive-resistive differential load, with the same common-mode feedback driving a differentially connected active device (for higher gain, improved noise abatement of the next stage, and common-mode control). The additional degree of design freedom yielded by the variable extent of the combination of these two topologies can now be exploited to determine the optimal mix of the two loads, which minimizes noise while maximizing the OPAMP gain-bandwidth product: i.e., the sampling rate of the system as a whole.

SUMMARY OF THE INVENTION

A high-gain, low-noise preamplifier suitable for use in a SHA front-end includes a differential pair of transistors receiving a bias current having a differential input and a differential output, a first resistor coupled to a first differential output node, a first transistor having a current path coupled between the first resistor and a power supply, a second resistor coupled to the first differential output node, a second transistor having a current path coupled between the second resistor and the power supply, a third resistor coupled to a second differential output node, a third transistor having a current path coupled between the third resistor and the power supply, a fourth resistor coupled to the second differential output node, and a fourth transistor having a current path coupled between the fourth resistor and the power supply, wherein a source of the second and third transistors are coupled together. A gate of the first, second, third, and fourth transistors receives a common-mode signal. The common-mode signal can be provided by a switched capacitor circuit, or by a continuous-time circuit. Both classes of circuits can be driven by the output of the preamplifier itself, or by the output any of the additional stages of an OPAMP comprising the preamplifier as the first stage of a cascade of additional stages. In the latter case, parasitic capacitors will be coupled to the differential output of the preamplifier, generally degrading the stability of the OPAMP. Each of the transistors in the preamplifier circuit can include an N-channel Field Effect Transistor (FET), a P-channel FET, an NPN Bipolar Junction Transistor (BJT), or a PNP BJT. Each of the resistors in the preamplifier circuit can include a doped or undoped polysilicon, p-or n-diffusion, metal such as Al, SiCr, or NiCr resistor.

BRIEF DESCRIPTION OF THE DRAWINGS

The accompanying drawings, which are incorporated in and constitute a part of this specification, illustrate embodiments of the invention and together with the description, serve to explain the principles of the invention. In the figures:

FIG. 1 is a schematic diagram of a feedback loop encompassing an operational amplifier according to the prior art;

FIGS. 2(a) and 2(b) are schematics of a "flip-around" switched capacitor Sample-and-Hold Amplifier (SHA) structure in the sampling phase, and in the holding phase, respectively, according to the prior art;

DETAILED DESCRIPTION

Figure 3:
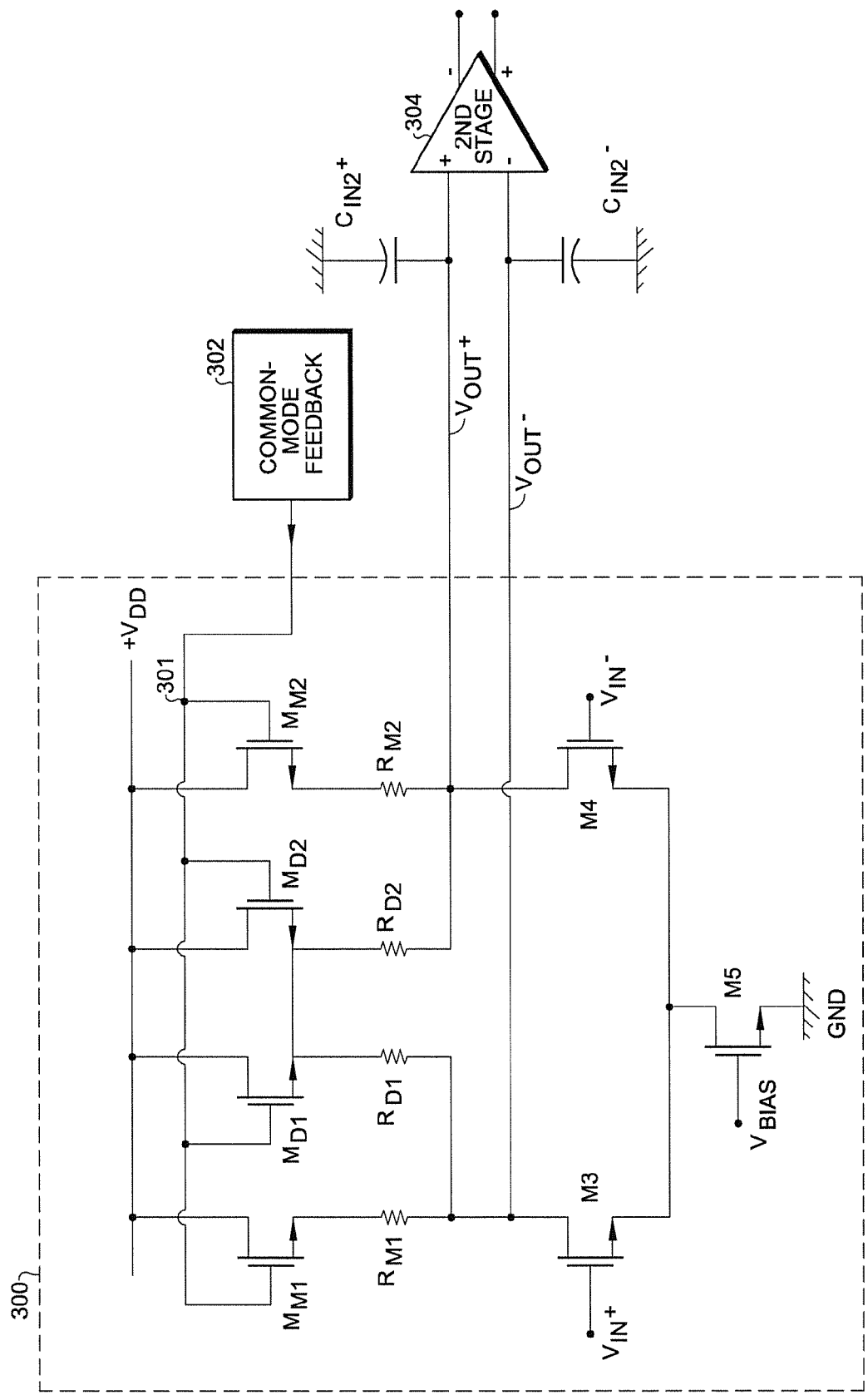
FIG. 3 is a simplified schematic diagram of an OPAMP including the preamplifier according to the present invention.

The new preamplifier topology according to the present invention is shown in FIG. 3. A high-gain low-noise preamplifier 300 suitable for use e.g., in a SHA front-end includes a differential pair of transistors M3, M4; receiving a bias current through the tail transistor M5 biased through the $V_{BIAS}$ node; having a differential input ($V_{IN+}$, $V_{IN-}$) and a differential output ($V_{OUT+}$, $V_{OUT-}$); a first resistor $R_{M1}$ coupled to a first differential output node, a first transistor $M_{M1}$ having a current path coupled between the first resistor $R_{M1}$ and a power supply +$V_{DD}$; a second resistor $R_{D1}$ coupled to the first differential output node, a second transistor $M_{D1}$ having a current path coupled between the second resistor $R_{D1}$ and the power supply +$V_{DD}$; a third resistor $R_{D2}$ coupled to a second differential output node, a third transistor $M_{D2}$ having a current path coupled between the third resistor $R_{D2}$ and the power supply +$V_{DD}$; a fourth resistor $R_{M2}$ coupled to the second differential output node, and a fourth transistor $M_{M2}$ having a current path coupled between the fourth resistor $R_{M2}$ and the power supply +$V_{DD}$, wherein a source of the second and third transistors $M_{D1}$, $M_{D2}$ are coupled together. A gate 301 of the first, second, third, and fourth transistors $M_{M1}$, $M_{D1}$, $M_{D2}$, $M_{M2}$ receives a common-mode signal. The common-mode signal can be provided by a common-mode feedback circuit 302. A pair of parasitic capacitors $C_{IN2+}$, $C_{IN2-}$ are coupled to the differential output of the preamplifier, for instance, due to the input of a second OPAMP stage 304 that is usually designed for much higher gain, large OPAMP output dynamic swing, and generates much higher input-referred noise as compared to the preamplifier.

Each of the transistors in the preamplifier circuit 300 can include an N-channel Field-Effect Transistor (FET), a P-channel FET, an NPN Bipolar Junction Transistor (BJT), or a PNP BJT. Each of the resistors in the preamplifier circuit 300 can include a doped or undoped polysilicon, p- or n-diffusion, metal such as Al, SiCr, or NiCr resistor.

In preamplifier 300, resistors $R_{D1}$, $R_{D2}$ identify the purely resistive differential load branches, whereas resistors $R_{M1}$, $R_{M2}$ identify the passive portion of mixed active/passive branches of the load circuitry. The additional $1/g_m$ impedance seen into the source of the devices $M_{M1}$ and $M_{M2}$ is connected in series to these resistors and tends to raise the combined value of the load, while the additional active device voltage noise ($4 kT \cdot 2/3 \cdot \gamma \cdot 1/g_{m\_M1}$ where $\gamma>1$ accounts for short-channel effects, as compared to $4 kT \cdot R_{M1}$) tends to worsen the total input-referred noise as compared to a purely resistive load. The optimal balance evidently depends on the amount of noise contributed by the second (often telescopic) stage, as well as on more subtle phase margin considerations that involve the placement of the parasitic pole ($R_{preamp\ load} \cdot C_{IN2+/-}$) generated by the output impedance of the preamplifier and the input capacitance of the stage it drives. As the addition of the active devices $M_{M1}$ and $M_{M2}$ altered the simple ohmic relation between bias current flowing in the mixed load branches and voltage drop across them, the other purely resistive branches comprised of $R_{D1}$ and $R_{D2}$ require that matching active devices be used to mirror the non-ohmic V(I) law of the $R_{M1}+M_{M1}$, $R_{M2}+M_{M2}$ combinations. Therefore, devices $M_{D1}$ and $M_{D2}$ are added purely as common-mode counterparts to $M_{M1}$ and $M_{M2}$; and their size must be ratioed to the size of $M_{M1}$ and $M_{M2}$, according to the ratio of the currents flowing into the purely resistive load branches, versus the current flowing into the mixed active/passive load branches. By way of example, if $R_{D1}=2 \cdot R_{M1}$, equal voltage drops across the resistor branches dictate $I_{D1}=I_{M1}/2$; hence to equalize the $V_{GS}$ drops across MOSFETs $M_{D1}$ and $M_{M1}$ (both assumed to operate in saturation region), and in order to connect the gates of all devices to the same node 301, one must necessarily design the width of transistors $M_{D1}$ and $M_{M1}$ to the ratio $W_{MD1}=W_{MM1}/2$. The same principle applies to the complementary side of the load, dictating that $R_{D2}=2 \cdot R_{M2}$ and $W_{MD2}=W_{MM2}/2$.

A practical embodiment of this principle can be most conveniently implemented:

a) by instancing a total number of branches comprised of identical transistors and resistors, connected in series by tying the source of each transistor to one terminal of a corresponding resistor;

b) then by connecting a subset of the newly created branches in parallel, by shorting the gates 301 of the active devices, the drains to a supply $+V_{DD}$, and the floating terminals of the resistors ($V_{OUT+/-}$ in FIG. 3), yet without shorting together the sources of the active devices; and c) finally, by connecting the remaining branches in parallel in much the same way, but also shorting together the sources of the remaining active devices.

In this way, the correct ratio-metric partition of the two types of loads is guaranteed by construction. This is easily proven by considering the common-mode circuit equivalent of the preamplifier in FIG. 4, whereby the intra-sources short can be cut in force of the symmetry of the circuit, making the two branches topologically identical.

It is important to note that the common-mode feedback circuit 302 shown in FIG. 3 can be realized by any circuit that is capable of sensing a common-mode voltage of a pair of differential nodes on the signal path inside the OPAMP (could be $(V_{OUT+}+V_{OUT-})/2$; or a buffered version of this voltage; or the common-mode voltage of the OPAMP output itself; or the common-mode voltage of the differential outputs of any internal stage of the OPAMP). Many circuits of this type are known in the art, including but not limited to those taught in the art set forth in the Background of the Invention, and can be used in conjunction with the preamplifier circuit of the present invention. For example, a switched-capacitor circuit or a continuous-time circuit can be used as is known in the art.

A simulated proof of the advantages provided by the invention has been sought and found in transient noise runs performed with a SPICE-like software engine.

A complete ADC's front-end SHA including an OPAMP with preamplifier+telescopic second stage topology has been simulated with both 0V differential input ("idle noise" test in ADC jargon) and sinusoidal differential input of −1 dBFS (decibel below Full Scale of the ADC, which was 2.5V differential peak-to-peak) amplitude. The runs involved:

a) An OPAMP with a preamplifier whose load comprises 64 NMOSFET parallel devices, each device driving a resistor, and no common-mode short connection (all devices are $M_{Mx}$, $R_{Mx}$)

b) Same OPAMP as a), with 8 devices out of 64 shorted across (56 $M_{Mx}$, $R_{Mx}$; 8 $M_{Dx}$, $R_{Dx}$).

c) Same OPAMP as a), with 16 devices out of 64 shorted across (48 $M_{Mx}$, $R_{Mx}$; 16 $M_{Dx}$, $R_{Dx}$).

d) Same OPAMP as a), with 24 devices out of 64 shorted across (40 $M_{Mx}$, $R_{Mx}$; 24 $M_{Dx}$, $R_{Dx}$).

Figure 4:
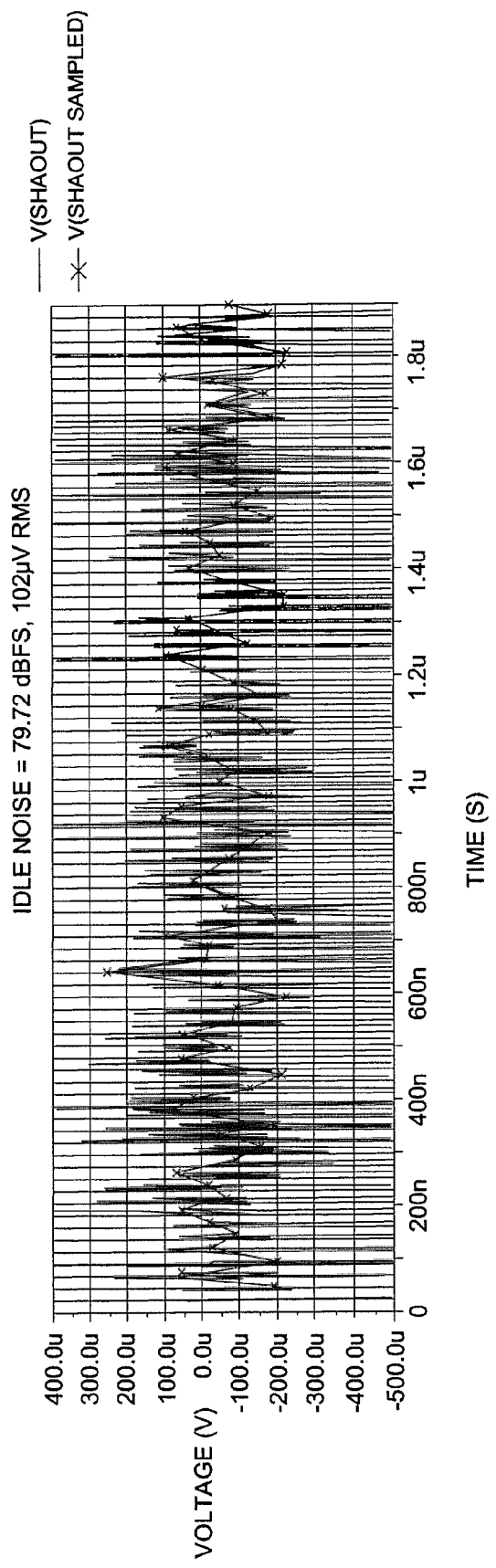
FIG. 4 is a time-domain plot that represents the differential voltage signal output and associated voltage noise resulting from a "transient noise" simulation of a Sample-and-Hold stage sampling a DC differential input of zero volts according to the present invention.
Figure 5:
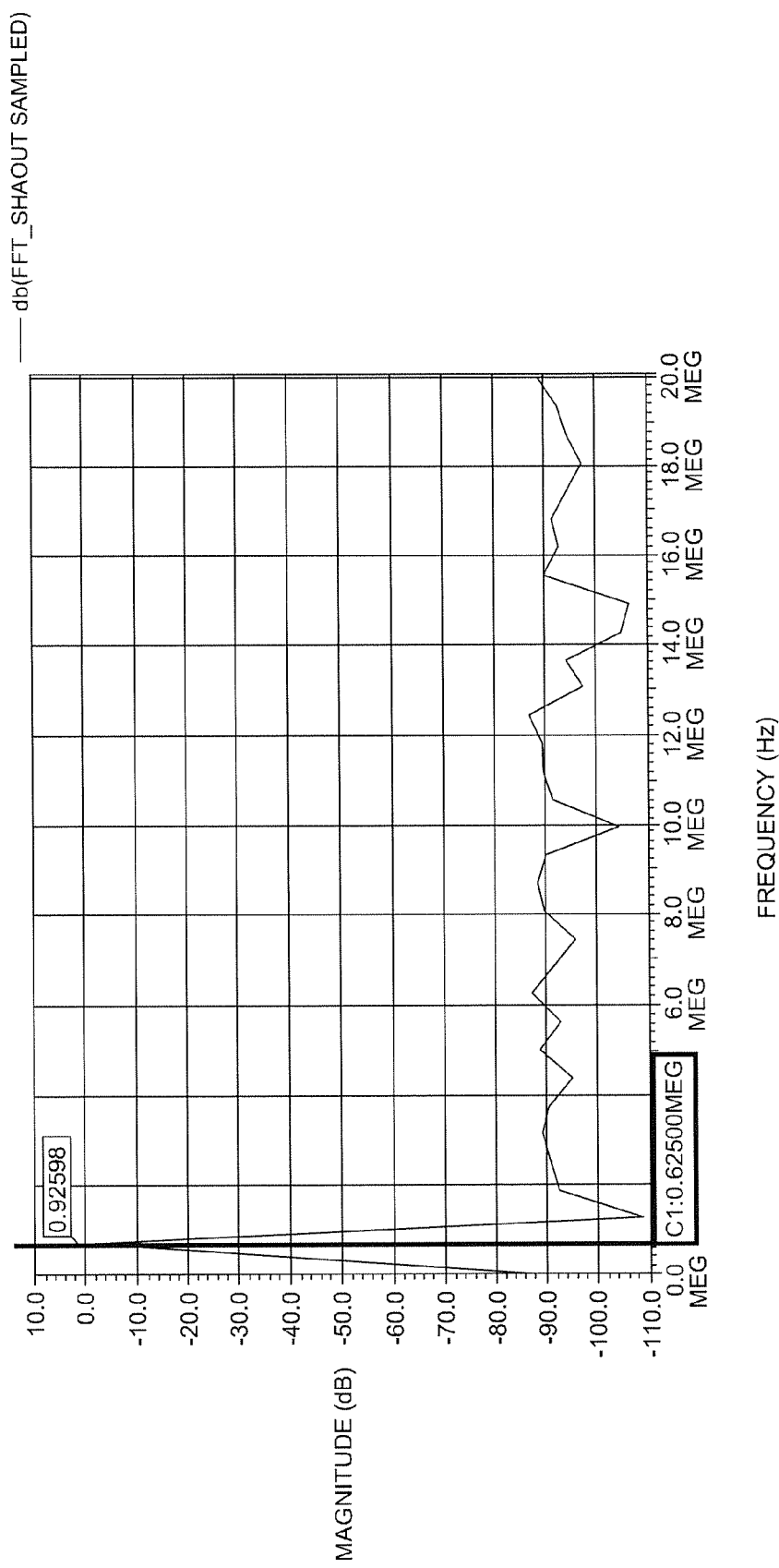
FIG. 5 is a frequency-domain plot that represents the amplitude spectrum (calculated via a Fast Fourier Transform, FFT) of the differential voltage signal output and associated voltage noise resulting from a "transient noise" simulation of a Sample-and-Hold stage sampling a sinusoidal input according to the present invention.

One example each of idle noise transient simulation in the time domain and of a transient-noise run producing the amplitude spectrum of a −1 dBFS amplitude, 625 kHz input frequency sinusoid sampled at 40 MSps (Mega Samples/second) clock rate are included, respectively in FIG. 4 and FIG. 5, for the case d) outlined above.

FIG. 4 is a time-domain plot that shows a SPICE-based "transient noise" simulation of a Sample-and-Hold stage sampling a DC differential input of 0V ("idle noise" test), depicting the differential output voltage in both clock phases Sample→Hold. Superimposed to the SHA output is the waveform obtained by re-sampling the SHA output at a specific instant of time during the Hold phase of each clock cycle. This other waveform represents the sampled SHA output signal, along with the noise affecting it, that will be processed by subsequent stages of the ADC, or of other analog sampled-signal system.

FIG. 5 is a frequency-domain plot that shows the amplitude spectrum (obtained via a Fast Fourier Transform, FFT) of the differential output voltage of a Sample-and-Hold stage sampling a differential input sinusoid 1-dB below 2.5V peak-to-peak (or ~89% of a "full-scale" test in ADC jargon) as the result of a "transient noise" SPICE-based simulation. FIG. 5 depicts the main signal tone at 625 kHz as well as the noise floor of the differential SHA output voltage obtained by re-sampling the SHA output at a specific instant of time during each clock cycle. This plot represents the spectrum of the sampled SHA output signal, along with the noise affecting it, in the exact way it will be processed by subsequent stages of the ADC, or of other analog sampled-signal system.

With the configurations chosen, the Signal/Noise Ratio of the SHA was obtained from each simulation. In the idle noise case, when the SNR is referred to a full-scale of 2.5V peak-to-peak, the simulations returned:

a) SNR=77.86 dBFS
b) SNR=79.24 dBFS
c) SNR=79.45 dBFS
d) SNR=79.62 dBFS while with a large sinusoid of −1 dBFS amplitude, the same full-scale referred SNR is:

a) SNR=75.53 dBFS
b) SNR=77.05 dBFS
c) SNR=77.08 dBFS
d) SNR=77.12 dBFS

These results demonstrate the suitability of the Invention's circuit approach up to 16-bit of practical ADC resolution; and they highlight the improvement provided by the transformation of differential noise into common-mode noise for this circuit, quantifying in ~1.6 dB the advantage provided by the invention in this instance. Also, as outlined previously and inherently by construction, the combination of active+passive resistive devices devised in this invention tracks identically over Process, Voltage and Temperature (PVT).

The SNR figures provided above are extracted from plots like the ones reported in this disclosure, by calculating:

in the case of FIG. 4, the RMS standard deviation ("1-sigma") of the Gaussian noise distribution sampled at the output of the SHA, in the face of an ideal sampled output of 0V differential; and taking the ratio of the ideal maximum RMS signal range to the RMS noise;

in the case of FIG. 5, the integral of the spectral density of the entire noise floor from 0 to Nyquist frequency (half of the sampling rate, i.e. 40 MSps/2=20 MHz), and taking again the same ratio, Finally, notice that although the performance of circuit configuration d) has been maximized noise-wise, the reduced gain of the preamplifier cuts into the Gain×BandWidth Product (GBW) of the whole OPAMP, ending up worsening the settling time characteristics of the Sample/Hold amplifier. A progressively over-damped SHA output, i.e. whose step response settles increasingly slowly from test case a) to test case d), ultimately determines a reduction in the maximum clock sample rate supported by the SHA, since the desired OPAMP output precision is achieved later in the transient. Notice that in the case of an ADC such SHA output precision directly impacts the resolution of the converter. The latter circumstance is the foremost example of the combined noise/speed tradeoff that this invention, with the additional degree of freedom it introduces in the schematic, permits the optimization of.

Having described and illustrated the principles of the invention in a preferred embodiment thereof, it is appreciated by those having skill in the art that the invention can be modified in arrangement and detail without departing from such principles. We therefore claim all modifications and variation coming within the spirit and scope of the following claims.

We claim:

1. A preamplifier comprising:
   a differential pair of transistors having a differential input and a differential output; and
   a plurality of load circuits coupled between the differential output and a source of supply voltage, wherein each load circuit comprises a transistor and a resistor in series combination, wherein sources of two transistors in two load circuits are directly coupled together, and wherein a drain of at least one of the transistors in the load circuits is coupled directly to the source of supply voltage,
   wherein a gate of the transistors in the load circuits receive a common-mode signal, the common-mode signal is provided by a switched capacitor circuit, and the switched capacitor circuit is part of a loop regulating the common-mode of the outputs of the preamplifier itself.

2. The preamplifier of claim 1 wherein the switched capacitor circuit is part of a loop regulating the common-mode of the outputs of an operational amplifier comprising the preamplifier, and at least one additional stage coupled to the differential output of the preamplifier.

3. The preamplifier of claim 1 wherein the switched capacitor circuit is part of a loop regulating the common-mode of the outputs of one of the additional stages of an operational amplifier comprising the preamplifier, and at least one additional stage coupled to the differential output of the preamplifier.

4. The preamplifier of claim 1 wherein the differential pair of transistors receives a bias current.

5. The preamplifier of claim 1 wherein the differential pair of transistors comprises an N-channel Field Effect Transistor (FET), a P-channel FET, an NPN Bipolar Junction Transistor (BJT), or a PNP BJT.

6. The preamplifier of claim 1 wherein the transistors in the load circuits each comprise an N-channel FET, a P-channel FET, an NPN BJT, or a PNP BJT.

7. The preamplifier of claim 1 wherein the resistors in the load circuits each comprise a polysilicon, p- or n-diffusion, metal, SiCr, or NiCr resistor.

8. A preamplifier comprising:
   a differential pair of transistors having a differential input and a differential output; and
   a plurality of load circuits coupled between the differential output and a source of supply voltage, wherein each load circuit comprises a transistor and a resistor in series combination, wherein sources of two transistors in two load circuits are directly coupled together, and wherein a drain of at least one of the transistors in the load circuits is coupled directly to the source of supply voltage,
   wherein a gate of the transistors in the load circuits receive a common-mode signal, the common-mode signal is provided by a continuous-time circuit, and the continuous-time circuit is part of a loop regulating the common-mode of the outputs of the preamplifier itself.

9. The preamplifier of claim 8 wherein the continuous-time circuit is part of a loop regulating the common-mode of the outputs of an operational amplifier comprising the preamplifier, and at least one additional stage coupled to the differential output of the preamplifier.

10. The preamplifier of claim 8 wherein the continuous-time circuit is part of a loop regulating the common-mode of the outputs of one of the additional stages of an operational amplifier comprising the preamplifier, and at least one additional stage coupled to the differential output of the preamplifier.

11. The preamplifier of claim 8 wherein the differential pair of transistors receives a bias current.

12. The preamplifier of claim 8 wherein the differential pair of transistors comprises an N-channel Field Effect Transistor (FET), a P-channel FET, an NPN Bipolar Junction Transistor (BJT), or a PNP BJT.

13. The preamplifier of claim 8 wherein the transistors in the load circuits each comprise an N-channel FET, a P-channel FET, an NPN BJT, or a PNP BJT.

14. The preamplifier of claim 8 wherein the resistors in the load circuits each comprise a polysilicon, p- or n-diffusion, metal, SiCr, or NiCr resistor.

* * * * *